United States Patent
Arita et al.

(10) Patent No.: US 7,767,554 B2
(45) Date of Patent: Aug. 3, 2010

(54) METHOD OF MANUFACTURING SEMICONDICTOR CHIP

(75) Inventors: Kiyoshi Arita, Fukuoka (JP); Atsushi Harikai, Saga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/517,632

(22) PCT Filed: Mar. 5, 2008

(86) PCT No.: PCT/JP2008/000455

§ 371 (c)(1),
(2), (4) Date: Jun. 4, 2009

(87) PCT Pub. No.: WO2008/123012

PCT Pub. Date: Oct. 16, 2008

(65) Prior Publication Data

US 2010/0022071 A1    Jan. 28, 2010

(30) Foreign Application Priority Data

Mar. 9, 2007    (JP)    .......................... P2007-059423

(51) Int. Cl.
*H01L 21/78*    (2006.01)
*H01L 21/46*    (2006.01)
*H01L 21/301*    (2006.01)

(52) U.S. Cl. ...................... 438/462; 438/113; 438/459; 438/460; 438/463; 438/464; 257/E21.238; 257/E21.599

(58) Field of Classification Search .......... 257/E21.238, 257/E21.599
See application file for complete search history.

(56) References Cited

U.S. PATENT DOCUMENTS 6,790,684 B2 *    9/2004    Ahn et al. ..................... 438/14

(Continued)

FOREIGN PATENT DOCUMENTS

JP    2001-250800 A    9/2001

(Continued)

OTHER PUBLICATIONS

International Search Report for PCT/JP2008/000455.

*Primary Examiner*—Charles D Garber
*Assistant Examiner*—Mohsen Ahmadi
(74) *Attorney, Agent, or Firm*—Pearne & Gordon LLP

(57) ABSTRACT

An object is to provide a semiconductor chip manufacturing method capable of removing test patterns in a higher efficiency in simple steps, while a general-purpose characteristic can be secured.

In a method in which a semiconductor wafer 1 having integrated circuits 3 formed in a plurality of chip regions and test patterns 4 formed in scribe lines 2*a* is divided by a plasma etching process so as to manufacture individual semiconductor chips, laser light 5*a* is irradiated from the side of a circuit forming plane 1*a* so as to remove the test patterns 4; and thereafter, under such a condition that a circuit protection seat 6 is adhered onto a circuit forming plane 1*a*, a rear plane of the circuit forming plane 1*a* is mechanically thinned; a mask-purpose seat is adhered onto the rear plane 1*b* of the semiconductor wafer 1 after the plane thinning process; and then, a plasma dicing-purpose mask is work-processed by irradiating laser light. As a consequence, the semi-conductor wafer 1 can be held by employing one set of the circuit protection seat 6 from the thinning process up to the plasma dicing process.

6 Claims, 12 Drawing Sheets

U.S. PATENT DOCUMENTS

| | | | |
|---|---|---|---|
| 7,678,670 B2 * | 3/2010 | Arita et al. ................. | 438/462 |
| 2006/0024924 A1 | 2/2006 | Haji et al. | |
| 2006/0281226 A1 | 12/2006 | Nakamura et al. | |

FOREIGN PATENT DOCUMENTS

| | | |
|---|---|---|
| JP | 2005-191039 A | 7/2005 |
| JP | 2006-179768 A | 7/2006 |
| WO | 2006-068284 A1 | 6/2006 |

* cited by examiner

[Fig. 1]
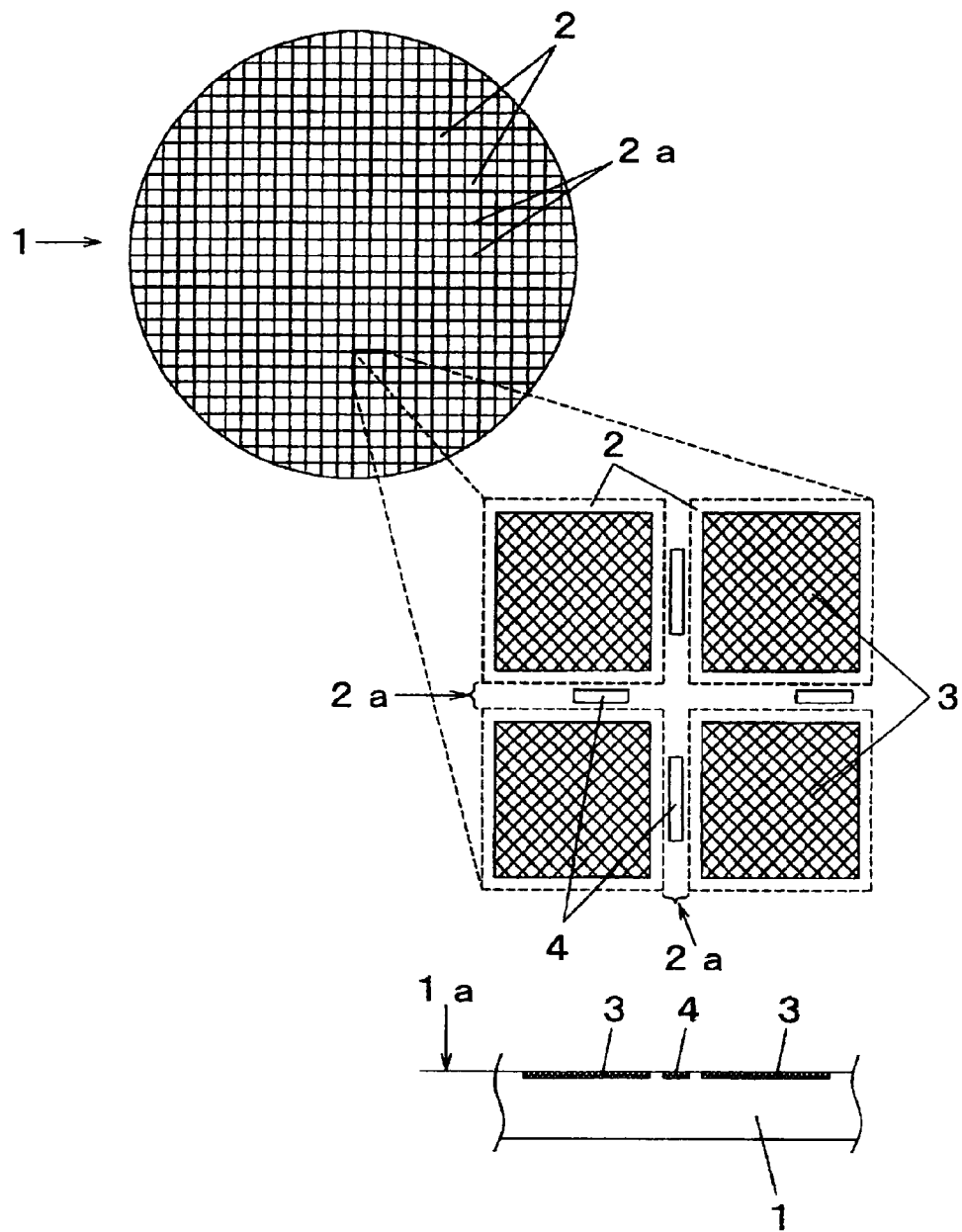

[Fig. 2]
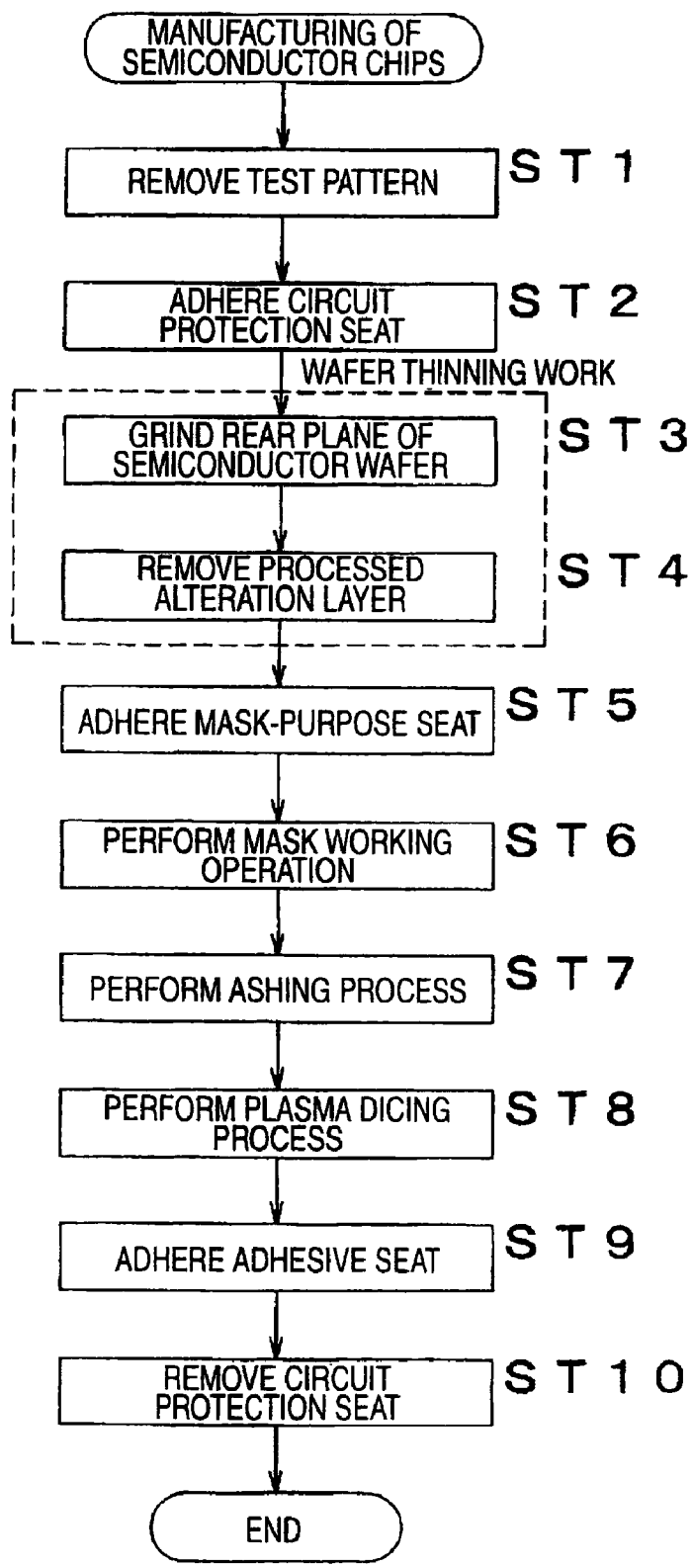

[Fig. 3]
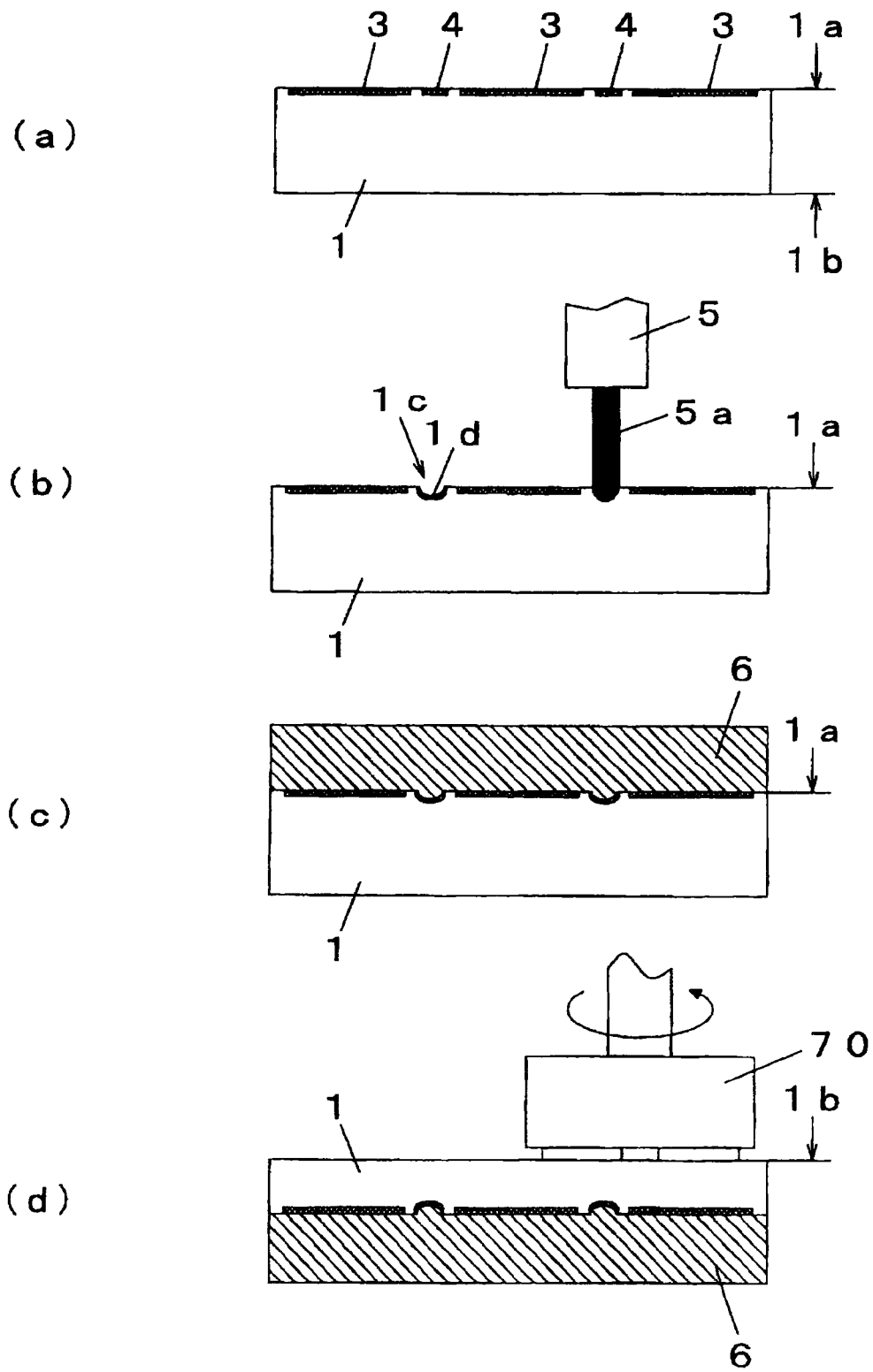

[Fig. 4]
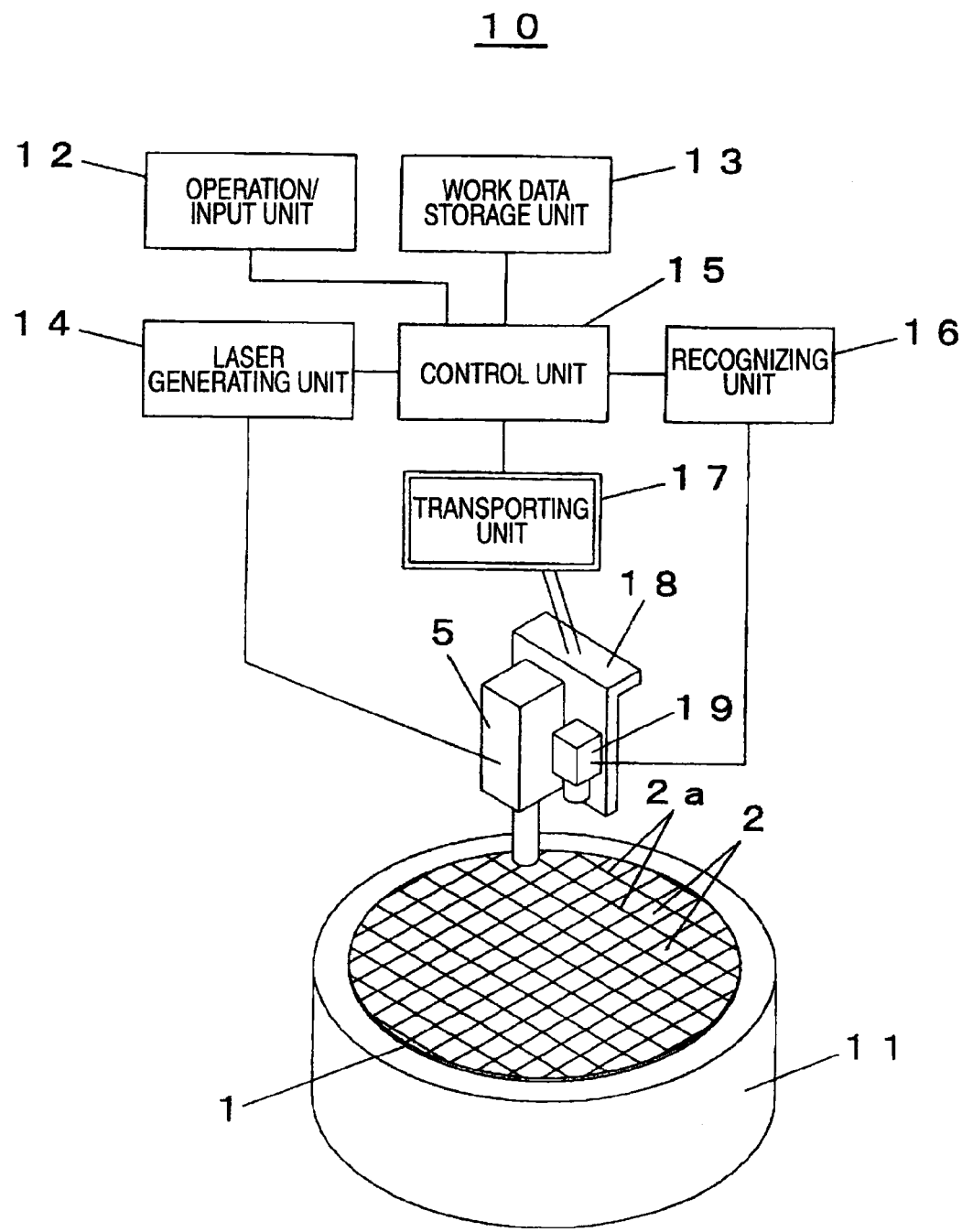

[Fig. 5]
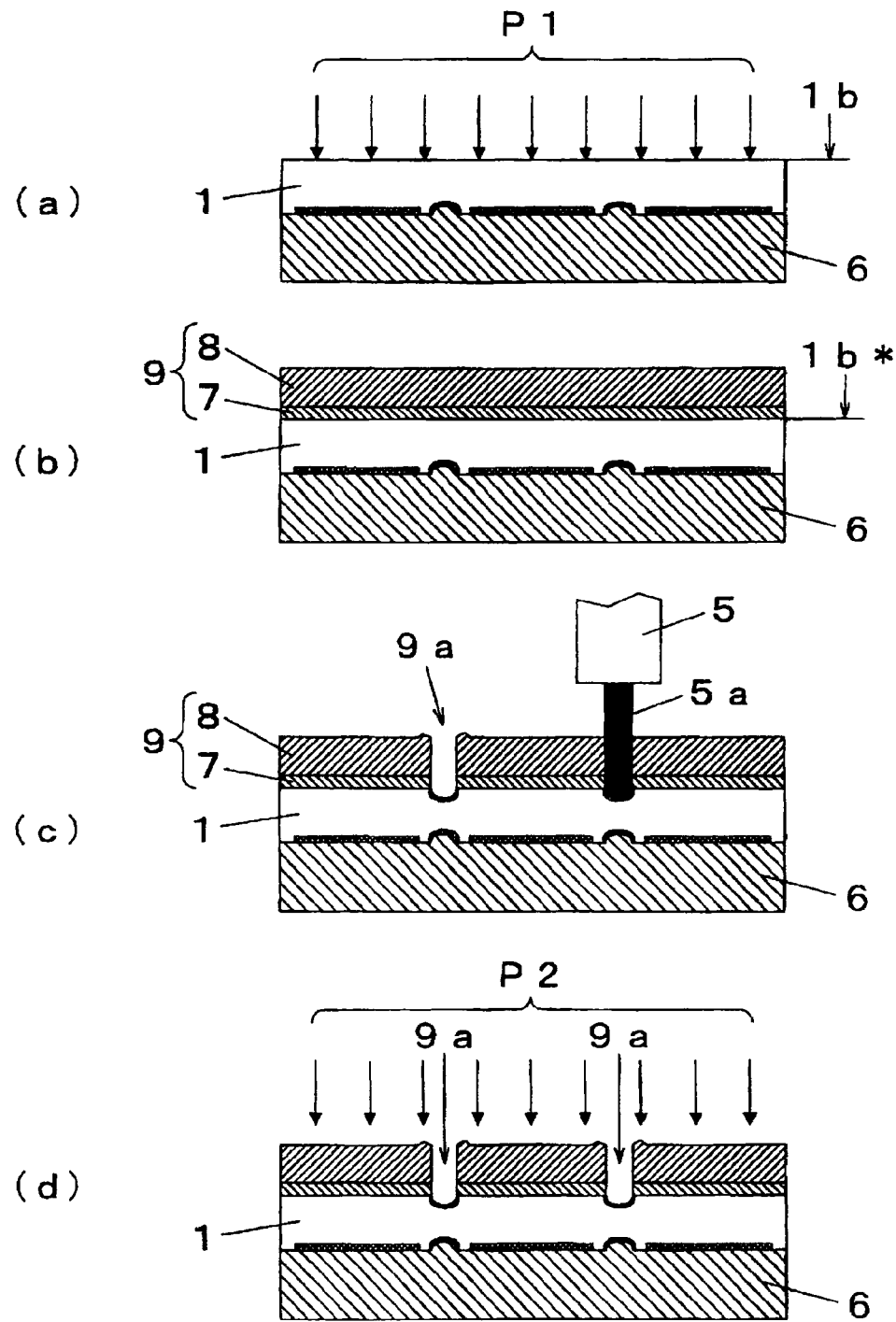

[Fig. 6]
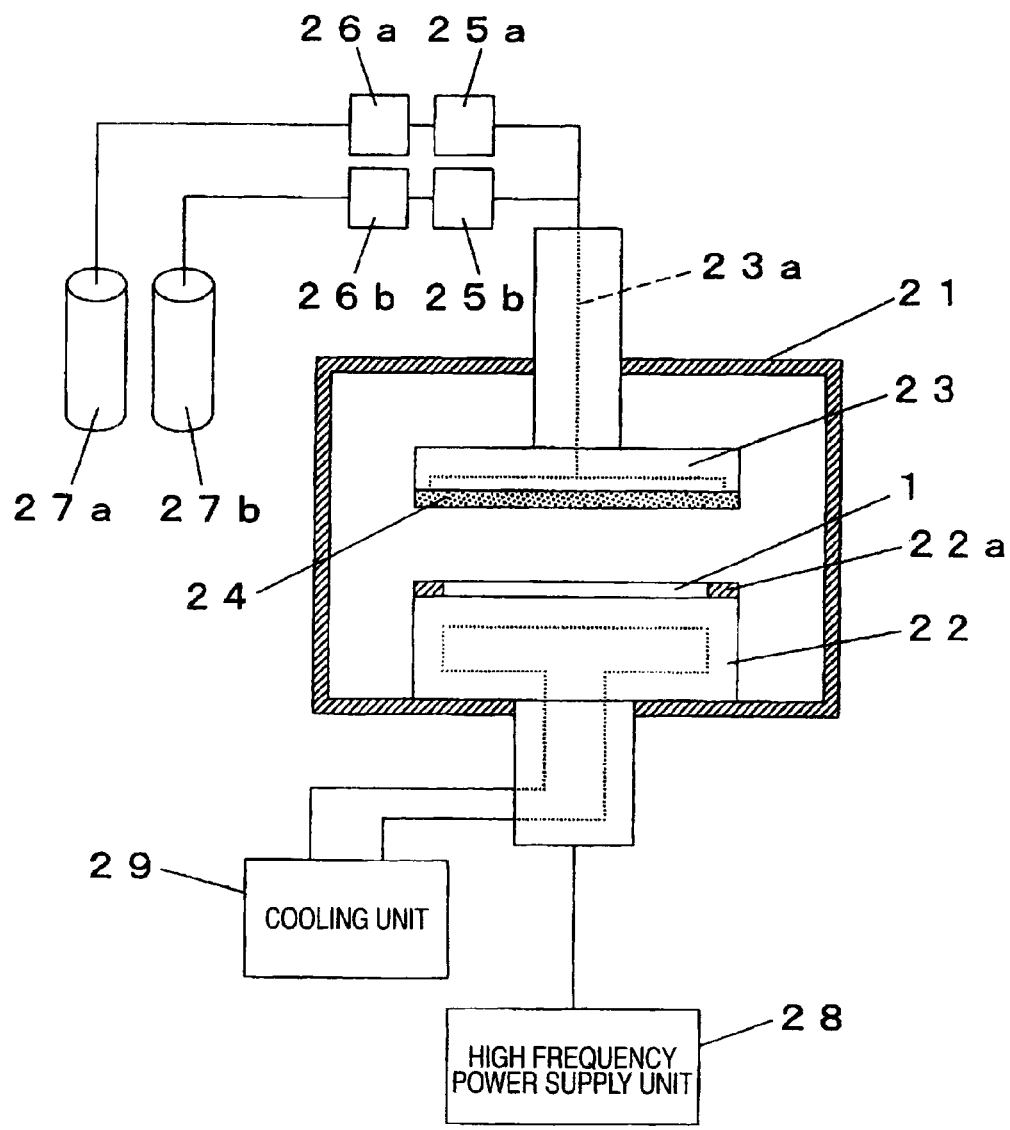

[Fig. 7]
(a)
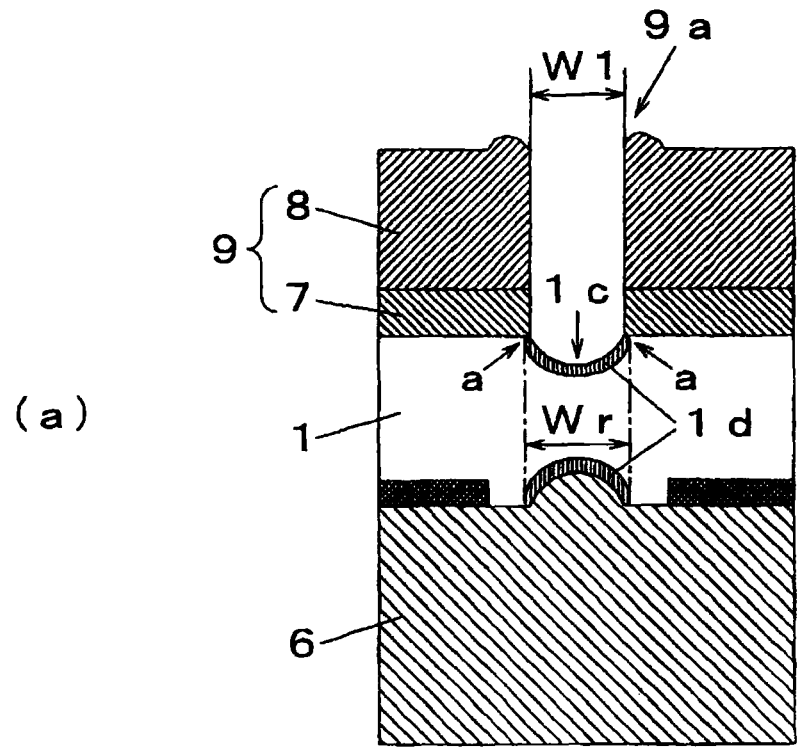
(b)
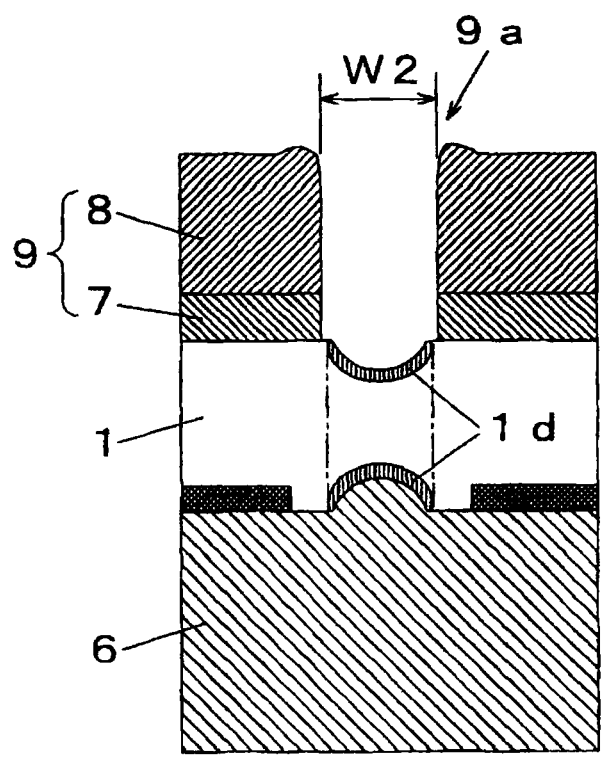

[Fig. 8]
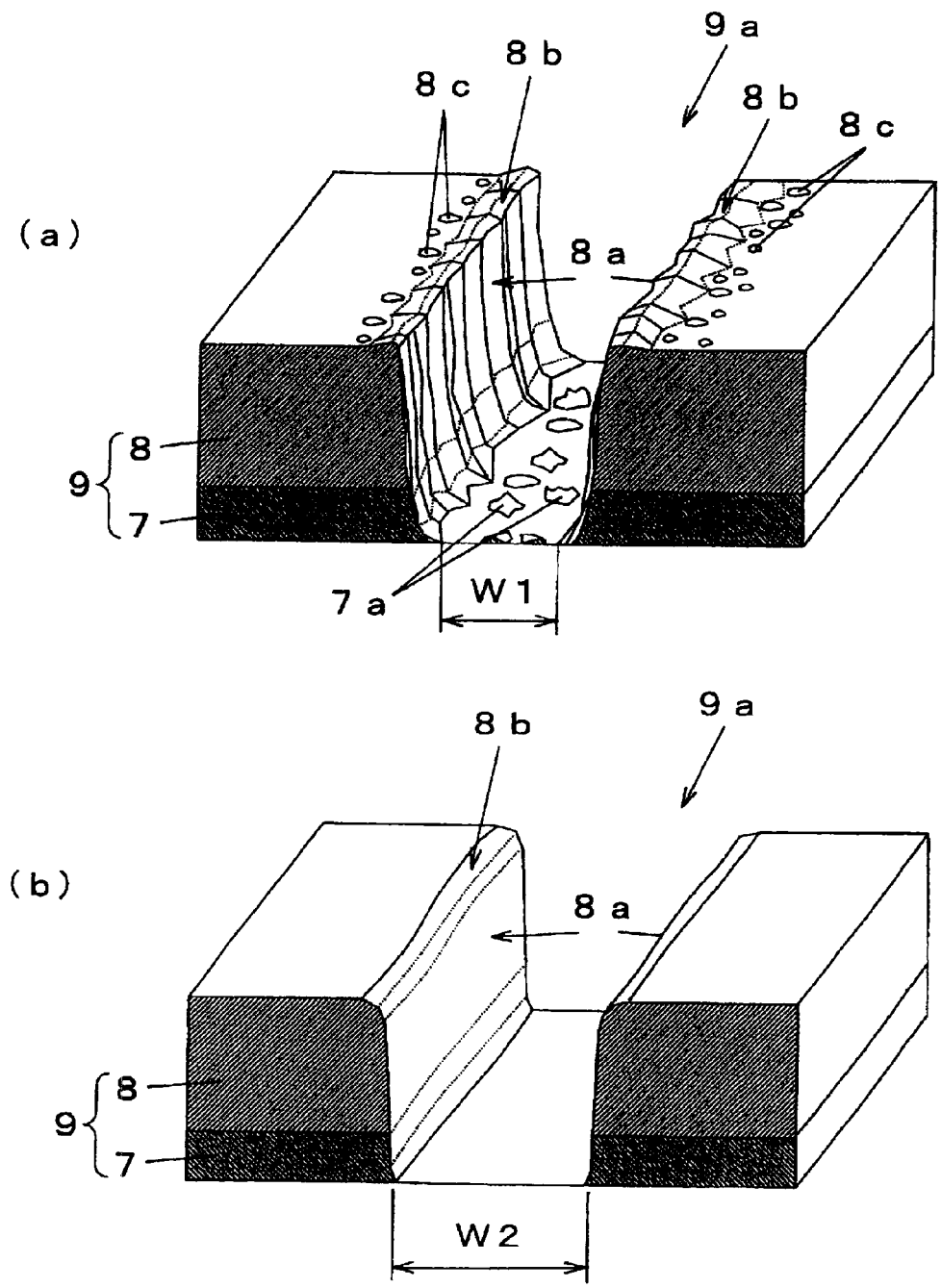

[Fig. 9]
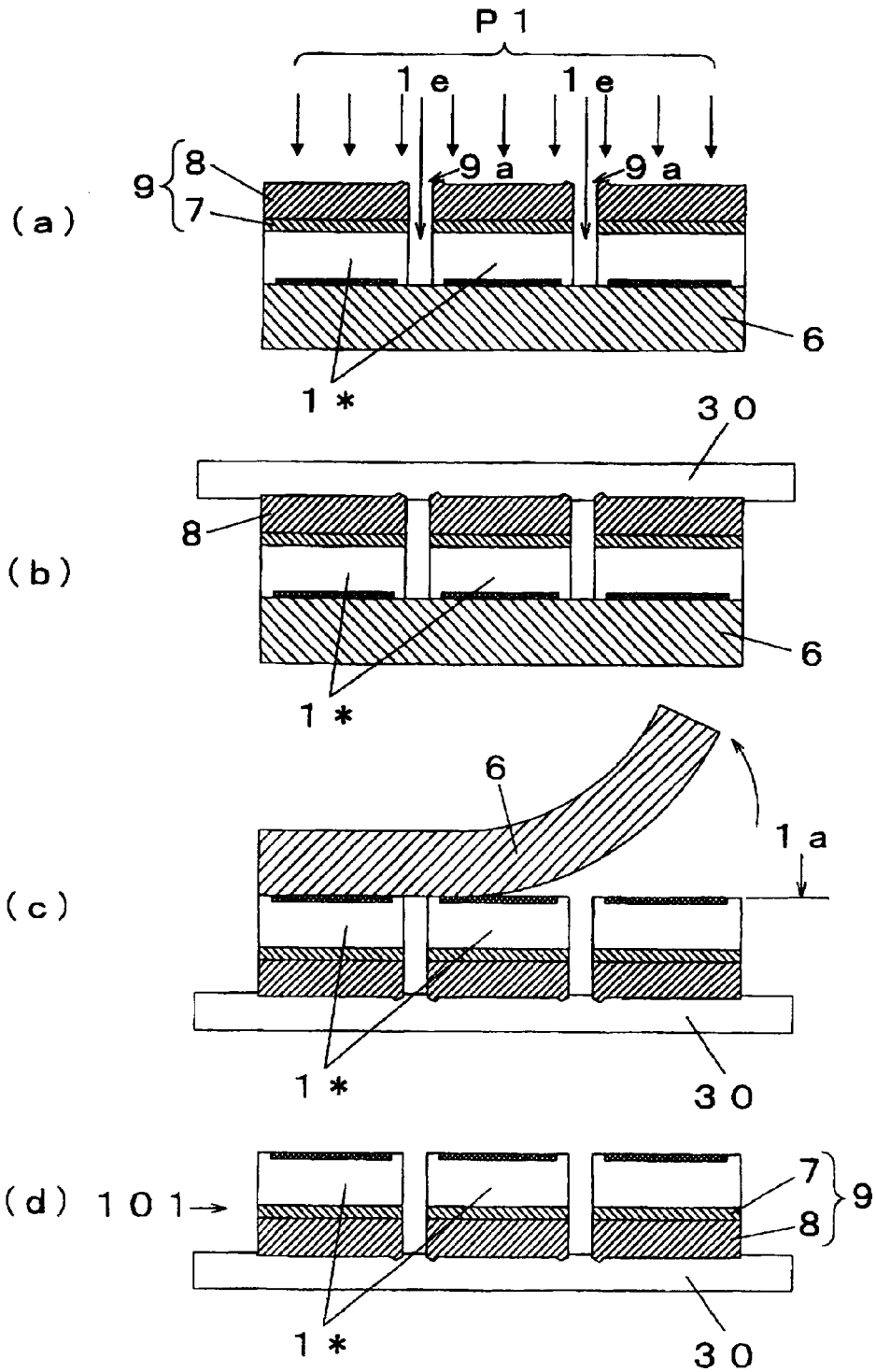

[Fig. 10]
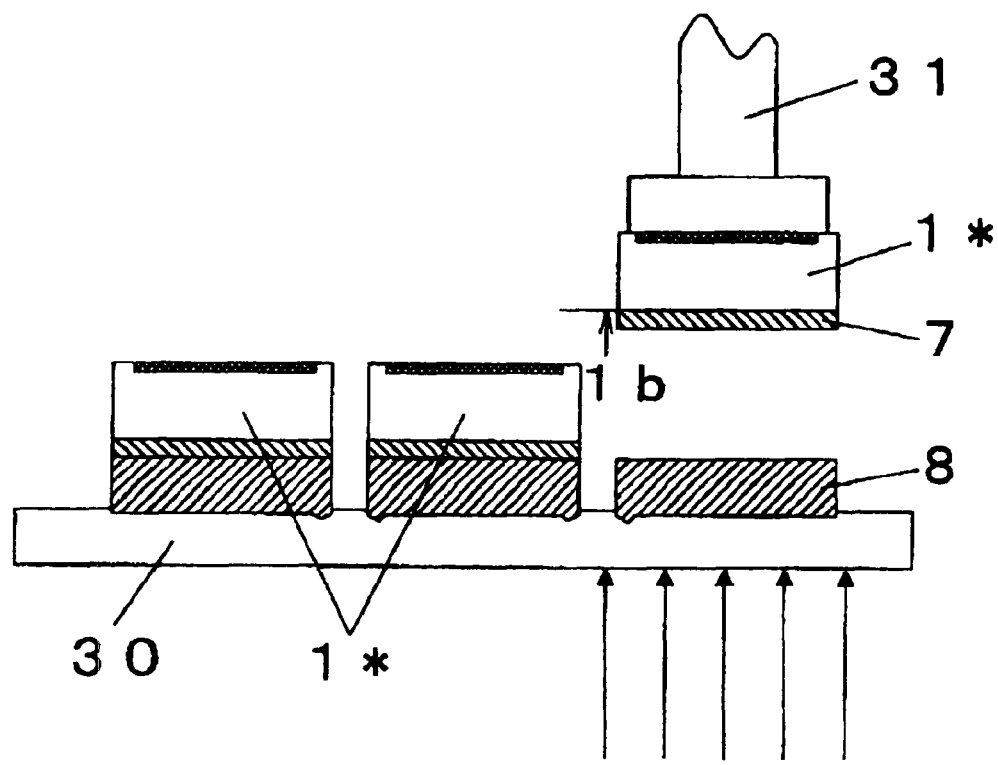

[Fig. 11]
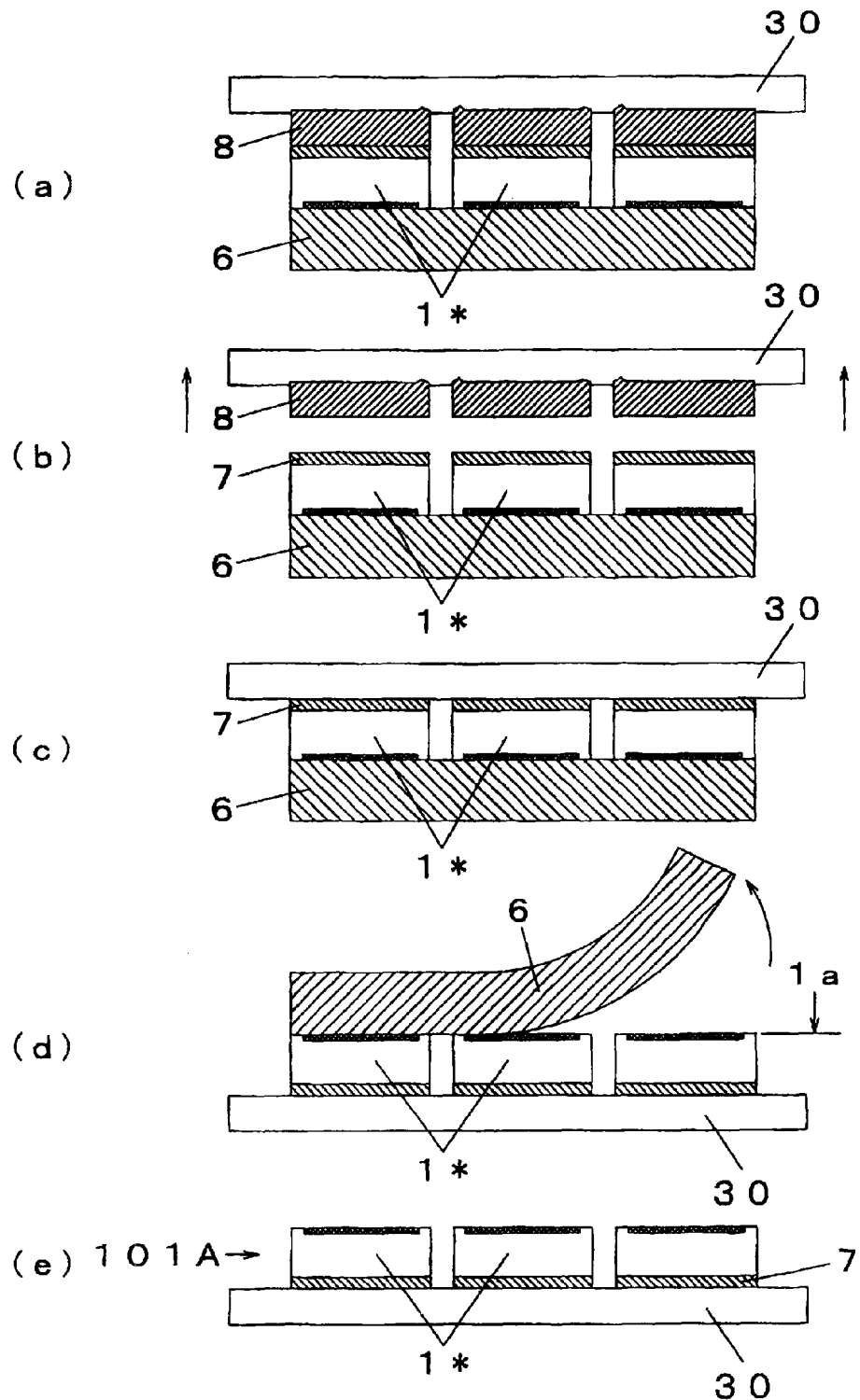

[Fig. 12]
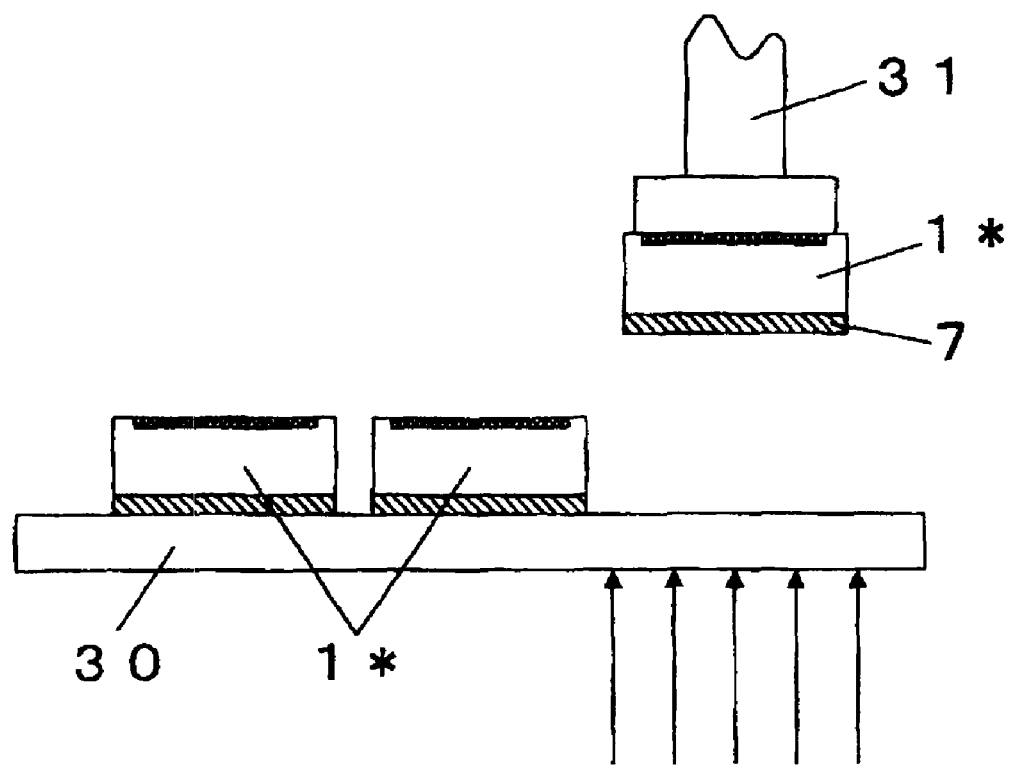

METHOD OF MANUFACTURING SEMICONDICTOR CHIP

TECHNICAL FIELD

The present invention is related to a semiconductor chip manufacturing method for manufacturing semiconductor chips by dividing a semiconductor wafer on which test patterns have been formed on scribe lines with respect to each of integrated circuits.

BACKGROUND ART

Semiconductor chips are manufactured in such a manner that after a plurality of integrated circuits have been formed in a batch mode under semiconductor wafer condition, the semiconductor wafer is cut along scribe lines so as to be divided with respect to each of the integrated circuits. While several wafer cutting methods have been conventionally employed, for instance, such a wafer cutting method is known that the wafer is mechanically cut by rotary blades (refer to, for example, patent publication 1); and instead of the mechanical cutting method, another wafer cutting method is known as a method based upon a plasma dicing process in which portions of the wafer which correspond to scribe lines are removed by a plasma etching process so as to divide the wafer (refer to, for example, patent publication 2), and the like.

On the other hand, in stages for manufacturing semiconductor chips, when circuit patterns are formed, test patterns employed in characteristic tests are formed on regions corresponding to the scribe lines; and after functions of these test patterns have been accomplished, these test patterns are cut off, or removed during dicing process. In the example shown in the patent publication 1, prior to the dicing process for cutting the wafer itself, the test patterns have been previously removed by employing the rotary blade having the wider width. As a result, since the entire portion of the test patterns are removed, it is possible to avoid "burrs" of cut planes, which occur when the test patterns are partially cut.

Then, another method indicated in a patent publication 3 has been proposed as to removing of the test patterns in such a case that the plasma dicing process is applied. That is, in this example, a protection seat is adhered to a circuit forming plane of a semiconductor wafer in such a manner that the protection seat is contacted to test patterns; subsequently, a plasma etching-purpose mask is formed on a rear plane of the circuit forming plane, and the wafer is cut by a plasma etching process; and then, such a test pattern which has not been removed in the plasma etching process but has been left is released in combination with the protection seat, and thus, is removed. As a consequence, after the plasma etching process, the side of the circuit forming plane is no longer plasma-ashed in order to remove the mask, and therefore, damages of the circuit forming plane caused by the plasma ashing process can be eliminated.

Patent Citation 1: JP-A-2001-250800

Patent Citation 2: JP-A-2005-191039

Patent Citation 3: JP-A-2006-179768

DISCLOSURE OF INVENTION

Technical Problem

Moreover, the conventional technical ideas described in the above-explained patent publications contain the following difficult points: That is, in the conventional example disclosed in the patent publication 1, since the cutting works by employing two sorts of the rotary blades are required in the dicing step, a total number of the processing steps is increased, so that the improvement in the productivity is impeded. Also, in the example disclosed in the patent publication 3, in such a case that the sizes of the test patterns are large and the test patterns have been formed in such a form that the semiconductor chips located adjacent to each other on the scribe lines are coupled to each other without any gap, the test patterns cannot be removed by performing only such a plasma etching process with employment of the process gas of the fluorine series. As a result, there is such a difficult point as to the general-purpose characteristic that the subject to be removable is limited. As previously explained, in the conventional semi-conductor chip manufacturing methods, there is the below-mentioned problem: That is, while the general-purpose characteristic is secured, the test patterns in the dicing step can be hardly removed in a higher efficiency and in simple steps.

As a consequence, the present invention has an object to provide a semiconductor chip manufacturing method capable of removing test patterns in a higher efficiency in simple steps, while a general-purpose characteristic can be secured.

Technical Solution

A semiconductor chip manufacturing method, according to an aspect of the present invention, is featured by such a semiconductor chip manufacturing method in which a semiconductor chip containing a plurality of integrated circuits formed in a plurality of regions segmented by a plurality of scribe lines and containing a plurality of test patterns formed in the scribe lines is divided by a plasma etching process so as to manufacture individual semiconductor chips with respect to each of the integrated circuits, and in which the semiconductor chip manufacturing method is comprised of: a test pattern removing step in which since laser light is irradiated from the side of circuit forming planes of the integrated circuits along the scribe lines of the semiconductor wafer, the test patterns are removed in combination with a front plane layer of the semiconductor wafer; a circuit protection seat adhering step for adhering a circuit protection seat on the circuit forming plane of the semiconductor wafer after the test pattern removing step is performed; a wafer rear plane grinding step for mechanically grinding the semiconductor wafer under such a condition that the circuit protection seat has been adhered from a rear plane of the circuit forming plane so as to thin the semi-conductor wafer; a mask-purpose seat adhering step for adhering a mask-purpose seat on the rear plane of the semiconductor wafer after the wafer rear plane grinding step is performed, the mask-purpose seat constituting a mask in the plasma etching process; a mask work-processing step by which since laser light is irradiated from the side of the mask-purpose seat along the scribe lines of the semiconductor wafer on which the mask-purpose seat has been adhered, only a predetermined width of the mask-purpose seat on the scribe lines is removed so as to work-process the mask; a plasma dicing step by which since a portion in the semiconductor wafer, which corresponds to the removed predetermined width of the mask-purpose seat, is plasma-etched after the mask work-processing step is performed, a damaged layer produced by irradiating the laser light is removed, and also, the semiconductor wafer is divided with respect to the individual integrated circuits; an adhesive seat adhering step by which an adhesive seat is adhered onto the semiconductor wafer after the plasma dicing process is performed by covering an upper plane of the mask-purpose seat, while the adhesive seat is employed in order to hold the semiconductor chips under such a condition that the semiconductor chips have been individually divided; and a circuit protection seat removing step for removing the circuit protection seat from the semiconductor wafer after the adhesive seat adhering step is performed.

Advantageous Effects

In accordance with the present invention, the below-mentioned plasma dicing-purpose mask working method is employed. That is, in this method, the laser light is irradiated from the side of the circuit forming plane so as to remove the test patterns; and thereafter, under such a condition that the circuit protection seat is adhered onto the circuit forming plane, the rear plane of the circuit forming plane is mechanically thinned; the mask-purpose seat is adhered onto the rear plane of the semiconductor wafer after the plane thinning process; and then, the plasma dicing-purpose mask is work-processed by irradiating the laser light. As a consequence, the semiconductor wafer can be held by employing one set of the circuit protection seat from the thinning process up to the plasma dicing process. Thus, while the general-purpose characteristic can be secured, the test patterns can be removed in the higher efficiency and in the simple steps.

BRIEF DESCRIPTION OF THE DRAWINGS

FIG. 1 is a detailed explanatory diagram of a semiconductor wafer which is employed in a semiconductor chip manufacturing method according to an embodiment mode of the present invention.

FIG. 2 is a flow chart for describing the semiconductor chip manufacturing method according to the embodiment mode of the present invention.

FIG. 3 is an explanatory diagram for explaining steps of the semiconductor chip manufacturing method according to the embodiment mode of the present invention.

FIG. 4 is a perspective view for representing a laser working apparatus which is used in the semiconductor chip manufacturing method according to the embodiment mode of the present invention.

FIG. 5 is a partial sectional view for showing a semiconductor wafer in the semi-conductor chip manufacturing method according to the embodiment mode of the present invention.

FIG. 6 is a sectional view for showing a plasma processing apparatus which is used in the semiconductor chip manufacturing method according to the embodiment mode of the present invention.

FIG. 7 is a partial sectional view for showing a semiconductor wafer in the semi-conductor chip manufacturing method according to the embodiment mode of the present invention.

FIG. 8 is a partial sectional view for showing a semiconductor wafer in the semi-conductor chip manufacturing method according to the embodiment mode of the present invention.

FIG. 9 is an explanatory diagram for explaining steps of the semiconductor chip manufacturing method according to the embodiment mode of the present invention.

FIG. 10 is an explanatory diagram for explaining steps of the semiconductor chip manufacturing method according to the embodiment mode of the present invention.

FIG. 11 is an explanatory diagram for explaining steps of the semiconductor chip manufacturing method according to the embodiment mode of the present invention.

FIG. 12 is an explanatory diagram for explaining steps of the semiconductor chip manufacturing method according to the embodiment mode of the present invention.

BEST MODE FOR CARRYING OUT THE INVENTION

A first description is made of a semiconductor wafer 1 with reference to FIG. 1, which is employed in a semiconductor chips manufacturing method according to the present embodiment mode of the present invention. In FIG. 1, the semiconductor wafer 1 has been segmented into a plurality of chip regions 2 (areas) having rectangular shapes by employing scribe lines 2a arrayed in a lattice shape so as to cut off respective semiconductor chips from each other. On a circuit forming plane 1a of the semiconductor wafer 1, each of integrated circuits 3 has been formed in each of the chip regions 2, and test patterns 4 have been formed in the scribe lines 2a. The test patterns 4 are employed for characteristic tests and the like in manufacturing steps of semiconductor chips, and are removed after the function of the test patterns 4 has been accomplished. In the semiconductor chip manufacturing method shown in the present embodiment mode, the semiconductor wafer 1 is divided by a plasma dicing process with employment of a plasma etching process with respect to each of these integrated circuit 3 so as to manufacture individual semiconductor chips.

Next, a description is made of detailed steps of the semiconductor chip manufacturing method in accordance with a flow chart shown in FIG. 2 with reference to respective drawings. In FIG. 2, first of all, while the semiconductor wafer 1 is employed as a subject, in which both the integrated circuits 3 and the test patterns 4 have been formed on the circuit forming plane 1a (refer to a part (a) in FIG. 3), the test patterns 4 formed in the scribe lines 2a is removed by employing a laser working apparatus 10 shown in FIG. 4 (test pattern removing step ST1).

Referring now to FIG. 4, a description is made of a construction of the laser working apparatus 10. In FIG. 4, the semiconductor wafer 1 where the chip regions 2 to be segmented by the scribe lines 2a have been formed on the front plane 1a has been held on a wafer holding unit 11. Above the wafer holding unit 11, a transport plate 18 on which both a laser irradiating unit 9 and a camera 19 have been mounted has been arranged in a freely transporting manner by a transporting mechanism 17. The laser irradiating unit 9 irradiate laser light 9a generated by a laser generating unit 14 with respect to the semiconductor wafer 1 located under the laser irradiating unit 9.

The camera 19 is an infrared camera, and images the semiconductor wafer 1 located under the camera 19 so as to image the integrated circuits 3, recognition marks, and the like of the semiconductor wafer 1. Then, imaged results are recognizing-processed by a recognizing unit 16, so that array positions of the integrated circuits 3 and the scribe lines 2a within the semiconductor wafer 1 can be detected. The laser generating unit 14, the recognizing unit 1b, and the transporting mechanism 17 are controlled by a control unit 15. When the control unit 15 controls these respective structural units in response to an operation instruction entered from an operation/input unit 12, the control unit 15 refers to data stored in a work data storage unit 13. Data related to the array positions of the scribe lines 2a, data related to dicing widths corresponding to widths of the scribe lines 2a, and further, data related to width dimensions of the test patterns 4 formed on the scribe lines 2a have been stored in the work data storage unit 13. A data writing operation with respect to the work data storage unit 13 may be carried out by the operation/input unit 12.

When the above-described laser working apparatus 10 performs a laser working operation while the semiconductor wafer 1 is employed as a working subject, the control unit 15 controls the transporting mechanism 17 based upon an actual position of the semiconductor wafer 1 detected by the recognizing unit 16, and the data indicative of the positions of the scribe lines 2a, which have been stored in the work data storage unit 13. As a result, the transporting mechanism 17 transports a laser irradiating unit 5 along the scribe lines 2a over the upper plane of the semiconductor wafer 1. Then, since the control unit 15 controls the laser generating unit 14 based upon the data stored in the work data storage unit 13, the test patterns 4 are removed which constitute the subject. Otherwise, since the control unit 15 controls the laser generating unit 14 based upon the above-described data, laser light having proper output power is irradiated from the laser irradiating unit 5. This laser light having the proper output power is required in order to remove a mask-purpose seat 9 (refer to FIG. 5) by such a removing width corresponding to a dicing width in the below-mentioned mask working operation.

Then, in the test pattern removing step ST3, since this laser working operation is carried out, a front plane layer is removed in combination with the test patterns 4, so that a concave portion 1c is formed in the circuit forming plane 1a of the semi-conductor wafer 1, while the front plane layer is positioned within a removing width range which is required in order to remove the test patterns 4 formed on the scribed lines 2a. At this time, a damaged layer 1d is formed in a bottom plane of the concave portion 1c. The damaged layer 1d is made by that a silicon component of the semi-conductor wafer 1 has been altered by performing the laser working operation. In other words, in this stage, since the laser light 5a is irradiated from the side of the circuit forming plane 1a of the integrated circuits 3 along the scribe lines 2a of the semiconductor wafer 1, the test patterns 4 which have been formed at positions corresponding to the scribe lines 2a in the semiconductor wafer 1 are removed in combination with the front plane layer of the semiconductor wafer 1.

Next, as shown in a part (c) of FIG. 3, a circuit protection seat 6 is adhered onto the side of the circuit forming plane 1a of the semiconductor wafer 1 after the test pattern removing step ST1 has been executed (circuit protection seat adhering step ST2). The circuit protection seat 6 is a resin seat having an adhesive layer. In this embodiment mode, such a UV (ultraviolet) tape has been employed, the adhesive force of which is lowered by being irradiated by ultraviolet rays. Thereafter, a wafer thinning work is carried out. That is, as shown in a part (d) of FIG. 3, the semiconductor wafer 1 under such a condition that the circuit protection seat 6 has been adhered onto the circuit forming plane 1a thereof is thinned by mechanically grinding the semiconductor wafer 1 by employing a grinding tool 70 from a rear plane 1b of the semiconductor wafer 1 up to a predetermined thickness thereof (wafer rear plane grinding step ST3). The rear plane 1b of the semiconductor wafer 1 is located opposite to the circuit forming plane 1a thereof. Next, as represented in a part (a) of FIG. 5, since an effect of fluorine gas plasma "P1" is given to the rear plane 1b after the semiconductor wafer 1 has been mechanically grinded, a processed alteration layer which has been produced by performing the mechanical grinding operation in the wafer rear plane grinding step ST3 is removed by a plasma etching process with employment of a plasma processing apparatus 20 shown in FIG. 6 (processed alteration layer removing step ST4).

Next, a description is made of the plasma processing apparatus 20 which is used in the above-described plasma etching process for removing the processed alteration layer and a plasma dicing process (will be discussed later) with reference to FIG. 6. In FIG. 6, an inner space of a vacuum chamber 21 has constituted a processing space which has been tightly sealed so as to perform a plasma processing operation with respect to the semiconductor wafer 1. Within the internal space of the vacuum chamber 21, a high frequency-sided electrode 22 and a gas supplying electrode 23 have been arranged in an opposite positioning manner. The semiconductor wafer 1 functioning as a subject to be processed is mounted on the high frequency-sided electrode 22 under such a condition that a peripheral portion of the semiconductor wafer 1 is surrounded by an insulating ring 22a, and the mounted semiconductor wafer 1 is held thereon by a vacuum suction manner, or an electrostatic suction manner.

A plasma generating-purpose gas supplying unit 27a and another plasma generating-purpose gas supplying unit 27b have been connected via opening/closing valves 25a, 25b, and flow rate control valves 26a, 26b to a gas supplying hole 23a formed in the gas supplying electrode 23, respectively. The plasma generating-purpose gas supplying unit 27a supplies a plasma generating-purpose gas of fluorine series which is employed in a plasma dicing process having such a purpose that silicon (namely, major component) of the semiconductor wafer 1 is removed so as to form a dicing groove and to remove the processed alteration layer. The plasma generating-purpose gas supplying unit 27b supplies either an oxygen gas or an oxygen mixture gas, which is employed in such a plasma processing operation for executing an ashing process having a purpose capable of removing the resin seat. Since the opening/closing valves 25a, 25b, and the flow rate control valves 26a, 26b are controlled, the sorts of plasma generating gases to be supplied to the gas supplying hole 23a can be selected, and the gas supply flow rates can be adjusted.

The supplied plasma generating-purpose gas is uniformly sprayed via a porous plate 24 mounted on a lower plane of the gas supplying electrode 23 with respect to the semiconductor wafer 1 mounted on the high frequency-sided electrode 21. Under the above-described condition, a high frequency power supply unit 28 is driven in order to apply a high frequency voltage. As a result, either plasma of the oxygen gas or plasma of the fluorine-series gas is generated between the gas supplying electrode 23 and the high frequency-sided electrode 22, so that a plasma processing operation for a purpose in each case is carried out by employing the generated plasma gas. In this plasma processing step, a cooling unit 29 is driven in order to circulate a coolant within the high frequency-sided electrode 22, and therefore, it is possible to avoid that a temperature of the semiconductor wafer 1 is increased by receiving heat of the generated plasma.

Thereafter, as indicated in part (b) of FIG. 5, a mask-purpose seat 9 is adhered onto such a rear plane "1b*" of the semiconductor wafer 1 after the alternation layer has been removed (step ST4) subsequent to the wafer rear plane grinding step ST3 (namely, mask-purpose seat adhering step ST5). The mask-purpose seat 9 constitutes a mask in a plasma etching process in order to divide the semiconductor wafer 1 into individual semiconductor chips. In is step ST5, while a resin seat 8 provided with a die attach film 7 is employed as the mask-purpose seat 9, the above-described mask-purpose seat 9 is adhered onto the rear plane "1b*" in such a manner that this die attach film 7 is contacted to the rear plane "1b*" of the semiconductor wafer 1. Also, an UV tape is designed to be employed as the resin seat 8, while the UV tape has been provided with an adhesive layer whose adhesive force is lowered by being irradiated by ultraviolet rays. In the die bonding step of the succeeding steps, the ultraviolet rays are irradiated from the lower plane side of the UV tape in the die bonding step of the succeeding steps, so that the individual semiconductor chips can be easily derived.

Next, a mask working operation is carried out by irradiating laser light with employment of the laser working apparatus 10 shown in FIG. 4 (step ST6). That is, as shown in a part (c) of FIG. 5, since the laser light 5a is irradiated from the side of the mask-purpose seat 9 along the scribe lines 2a of the semiconductor wafer 1 on which mask-purpose seat 9 has been adhered, only a predetermined width of the mask-purpose seat 9 adhered on the scribe lines 2a is removed so as to form a groove portion 9a and to work-process a mask for a plasma dicing process (mask working step ST6). The predetermined width corresponds to a dicing width.

In the mask working operation by utilizing the laser light 5a, a resin component of a boundary line region corresponding to a scribe line 2a of the mask-purpose seat 9 is removed by the laser light 5a, so that the above-described groove portion 9a is formed. Then, a bottom portion of the groove portion 9a has reached up to a lower plane of the mask-purpose seat 9, namely, a lower plane of the die attach film 7, and thereafter, the effect of the laser light 5a may be given to the semiconductor wafer 1. As a result, similar to the concave portion 1c shown in a part (b) of FIG. 3, such a concave portion 1c that the front plane layer of the semiconductor wafer 1 has been removed by the laser light 5a is formed in the front plane of the semiconductor wafer 1. Then, another damaged layer 1d containing very small cracks is formed on a bottom plane of the concave portion 1c.

If such damaged layers 1d are merely left, then strengths of the semiconductor wafer 1 are lowered. Accordingly, these damaged layers 1d must be removed. In the present embodiment mode, in such a plasma dicing step ST8 that the semiconductor wafer 1 is divided by performing a plasma etching process, the damaged layers 1d are tried to be removed at the same time, while the damaged layers 1d have been formed on both the circuit forming plane 1a and the rear plane 1b of the semiconductor wafer 1. At this time, as shown in a part (a) of FIG. 7, a producing range of the damage layers 1d has been enlarged by exceeding an opening width "W1" of the bottom portion of the groove portion 9a. In such a case that the opening width "W1" is narrower than a minimum removing width "Wr" where the damaged layers 1d are not left, the damaged layers 1d are brought into such a condition that the damaged layers 1d are partially covered by the lower plane of the circuit protection seat 6 (refer to arrow "a" indicated in a part (a) of FIG. 7). Under such a condition, the effect of the plasma etching process cannot be given to the portion of the damaged layers 1d which are covered by the lower plane of the mask-purpose seat 9, but even after the semiconductor wafer 1 has been divided into the individual semiconductor chips by the plasma dicing process, there are some possibilities that the damaged layers 1d may be partially left.

As a consequence, such a process operation capable of completely removing the above-described harmful damaged layers 1d in the plasma dicing process is carried out (step ST7). Namely, a so-called "ashing" process is carried out in order that the opening width "W1" of the groove portion 9a of the mask-purpose seat 9 is enlarged by the plasma etching process to become such an opening width "W2" which is wider than the above-described minimum removing width "Wr", so that all of the damaged layers 1d are exposed to the bottom portion of the groove portion 9a. This ashing process is executed by performing a preliminary plasma etching process for enlarging the opening width of the groove portion 9a of the mask-purpose seat 9 removed by the laser light 5a prior to an execution of a plasma dicing step ST8.

In other words, while the semiconductor wafer 1 obtained after the mask working step ST6 is employed as the subject, such a plasma processing operation that either the oxygen gas or the oxygen mixture gas is utilized as the plasma generating-purpose gas is carried out. As a result, as shown in part (a) of FIG. 5, an effect of oxygen gas plasma "P2" is given with respect to the semiconductor wafer 1 on which the groove portions 9a have been formed in the mask-purpose seat 9, so that an isotropic etching effect caused by the oxygen gas plasma "P2" is given inside the mask-purpose seat 9 and the groove portions 9a, and also, an ashing process is carried out by which the circuit protection seat 6 corresponding to an organic substance is brought into ash so as to be removed by the oxygen gas plasma "P2".

A detailed effect achieved by the above-described ashing process will now be described with reference to FIG. 8. A part (a) of FIG. 8 shows a condition of a groove portion 9a after the mask working operation by the laser light has been performed. As indicated in part (a) of FIG. 8, in the groove portion 9a after the mask working operation has been carried out, an inner side plane 8a of the resin seat 8 is not a smoothing plane, but is brought into such a condition that concave/convex portions having very fine stripe shapes have been formed. Then, burr portions where the melted resin seat 8 has been upwardly raised and solidified have been formed at an upper edge portion 8b of an upper edge of the groove portion 9a. Also, a portion located in the vicinity of the upper edge portion 8b is brought into such a condition that sputters 8c have adhered. In the sputters 8c, the resin components of the resin seat 8 which have been once melted have been solidified in very small particle shapes. In addition, remainders 7a have been present on the bottom portion of the groove portion 9a, while unremoved portions of the die attach film 7 are partially left in these remainders 7a. Then, under the above-described condition, an opening width of the groove portion 9a at the bottom portion becomes "W1" which is smaller than the above-described minimum removing width "Wr".

A part (b) of FIG. 8 represents such a condition of the groove portion 9a obtained after an ashing process has been carried out by the oxygen gas plasma "P2" with respect to the condition shown in part (a) of FIG. 8. As represented in this drawing, due to the isotropic etching effect by the oxygen gas plasma "P2", the concave/convex portions are smoothed which are present on the surface of the resin seat 8 and inner portions of the inner side plane 8a, so that the inner side plane 8a and the upper edge portion 8b may become smooth surfaces, and thus, the sputters 8c and the remainders 7a disappear. Then, the etching effect is given to the inner side plane 8a and the bottom portion of the groove portion 9a, so that an opening width of the groove portion 9a is enlarged to become "W2" which is wider than the above-described opening width "W1" and "Wr" shown in part (a) of FIG. 8. As a result, the below-mentioned improvement as to the damaged layers 1d may be achieved. That is, as shown in part (a) of FIG. 7, such a condition that the damaged layers 1d have been partially covered by the mask-purpose seat 9 at the both edge portions thereof (refer to arrow "a") may be changed into such a condition that the entire portion of the damaged layers 1d is exposed within the groove portion 9a (as indicated in part (b) of FIG. 7). The below-described plasma dicing process will be carried out under such condition that the dicing width has been enlarged.

Next, the above-described plasma dicing process is carried out (step ST8). That is, as indicated in part (b) of FIG. 9, portions of the semiconductor wafer 1 after the aching process step ST7 are plasma-etched, while the above-described portions correspond to the enlarged dicing width (predetermined width), so that the damaged layers 1d produced by irradiating the laser light 5a are removed, and further, the semiconductor wafer 1 is divided with respect to each of the integrated circuits 3 (plasma dicing step ST8). As a result, the semiconductor wafer 1 is divided into individual semiconductor chips "1*". Thereafter, as indicated in part (b) of FIG. 9, an adhesive seat 30 is adhered onto the semiconductor wafer 1 after the plasma dicing process has been carried out by covering the resin seat 8 of the upper plane of the mask-purpose seat 9 (adhesive seat adhering step ST9). The adhesive seat 30 is employed so as to hold the semiconductor chips 1* under divided condition.

Next, the circuit protection seat 6 is removed from the semiconductor wafer 1 after the adhesive seat adhering step ST9 has been carried out (circuit protection seat removing step ST10). In other words, as shown in part (c) of FIG. 9, after the semi-conductor wafer 1 on which the adhesive seat 30 has been adhered is turned over along the upper/lower direction and then the adhesive seat 30 is located on the side of the lower plane, the circuit protection seat 6 is upwardly torn off, so that the circuit protection seat 6 is released from the upper plane 1a of the semiconductor wafer 1 with respect to the respective semiconductor chips "1*". At this time, ultraviolet rays have been previously irradiated onto the circuit protection seat 6 so as to lower the adhesive force of the circuit protection seat 6. Then, as a consequence, as indicated in part (d) of FIG. 9, an assembled body 101 of the semiconductor chips "1*" may be accomplished. The assembled body 101 has such a structure that the semiconductor chips "1*" manufactured by dividing the semiconductor wafer 1 shown in FIG. 1 into the individual semiconductor chips "1*" with respect to each of the integrated circuits 3 have been held via the mask-purpose seat 9 on the adhesive seat 30.

The assembled body 101 of the semiconductor chips "1*" is transported to a die bonding step under such a condition that this assembled body 101 is held by such a jig as a wafer ring, and then, as represented in FIG. 10, the individual semiconductor chips "1*" are sequentially derived one by one from the adhesive seat 30 by being held by a holding tool 31. When the semiconductor chips "1*" are derived, since ultraviolet rays are previously irradiated from the lower plane side of the adhesive seat 30, the adhesive force of the resin seat 8 for adhering the die attach film 7 is lowered, so that these semiconductor chips "1*" may be derived under such a condition that the die attach film 7 adhered onto the rear plane 1b has been separated from the resin seat 8. Then, the derived semiconductor chips "1*" are bonded on a board (not shown) via the die attach film 7 corresponding to the adhesive layer.

It should be understood that in the above-described embodiment mode, the below-mentioned technical difficult point may occur. That is, in the mask working step ST6 shown in part (c) of FIG. 5, in the sectional plane of the groove portion 9a where the laser light 5a has penetrated through the mask-purpose seat 9, edge planes of both the die attach film 7 and the resin seat 8 are melted by receiving heat of the laser light 5a. As a result, when a semiconductor chip "1*" shown in FIG. 10 is derived, there are some possibilities that the die attach film 7 and the resin seat 8 can be hardly separated from each other. In such a case, the below-mentioned method for adhering the adhesive seat 30 two times is employed.

Similar to the condition indicated in FIG. 9, a part (a) of FIG. 11 represents such a condition that the adhesive seat 30 has been adhered onto the resin seat 8 after the plasma dicing process. At this time, ultraviolet rays have been previously irradiated to the resin seat 8 before the resin seat 30 is adhered so as to lower the adhesive force of the resin seat 8. Next, as shown in part (b) of FIG. 11, the adhesive seat 30 is upwardly separated. As a result, the resin seat 8 whose adhesive force has been lowered may be separated from the die attach film 7 so as to be released in combination with the adhesive seat 30.

Next, as indicated in part (c) of FIG. 11, an adhesive seat 30 is again adhered onto the upper plane of the die attach film 7. Then, as shown in part (d) of FIG. 11, after the semiconductor wafer 1 on which the adhesive seat 30 has been again adhered is turned over along the upper/lower direction and then the adhesive seat 30 is located on the side of the lower plane, the circuit protection seat 6 is upwardly torn off, so that the circuit protection seat 6 is released from the circuit forming plane 1a of the semi-conductor wafer 1 with respect to the respective semiconductor chips "1*". At this time, ultraviolet rays have been previously irradiated onto the circuit protection seat 6 so as to lower the adhesive force of the circuit protection seat 6.

As a consequence, as indicated in part (e) of FIG. 11, an assembled body 101A of the semiconductor chips "1*" may be accomplished, while the assembled body 101A has such a structure that the semiconductor chips "1*" have been held via the die attach film 7 on the adhesive seat 30. Then, in a die bonding step, as indicated in FIG. 12, while the individual semiconductor chips 1* are held by the holding tool 31, these semiconductor chips 1* are sequentially derived one by one from the adhesive seat 30. At this time, if an UV tape is employed as the adhesive seat 30, similar to the example shown in FIG. 10, since ultraviolet rays have been previously irradiated onto the adhesive seat 30, the semiconductor chips 1* may be readily derived therefrom.

In other words, in the above-described embodiment, the adhesive seat adhering step has been embodied by containing a first adhesive seat adhering step, a resin seat releasing step, and a second adhering seat adhering step. In the first adhesive seat adhering step, the adhesive seat 30 is adhered by covering the upper plane of the resin seat 8. The resin seat releasing step releases the resin seat 8 in combination with the adhesive seat 30 after the first adhesive seat adhering step. In the second adhesive seat adhering step, the adhesive seat 30 is adhered by covering the upper plane of the die attach film 7 after the resin seat separating step.

As previously described, in the semiconductor chip manufacturing method disclosed in the present embodiment mode, the below-mentioned plasma dicing-purpose mask working method has been employed. That is, the laser light is irradiated from the side of the circuit forming plane 1a so as to remove the test patterns 4; and thereafter, under such a condition that the circuit protection seat 6 is adhered onto the circuit forming plane 1a, the rear plane 1b of the circuit forming plane 1a is mechanically thinned; the mask-purpose seat 9 which constitutes the mask in the plasma etching process is adhered onto the rear plane 1b of the semiconductor wafer 1 after the plane thinning process; and then, the plasma dicing-purpose mask is work-processed by irradiating the laser light.

As a consequence, the semiconductor wafer 1 can be held by employing one set of the circuit protection seat 6 from the thinning process up to the plasma dicing process. Thus, while the general-purpose characteristic can be secured, the test patterns 4 can be removed in the higher efficiency and in the simple steps. In other words, the simplification of the removing steps for the test patterns 4 can be realized, as compared with the conventionally employed various sorts of methods, for instance, the method for mechanically removing the test patterns by employing two sorts of the rotary blades in the dicing step.

Moreover, the method indicated in the present embodiment mode may also be applied to such a case that while sizes of test patterns are made large, the test patterns have been formed in such a manner that semiconductor chips located adjacent to each other on scribe lines are coupled to each other without any gap. Also, in accordance with the above-described method, such an etching process using poisonous gas such as chlorine-series gas is no longer required which has been employed in the conventional test pattern forming case, the test patterns can be removed in the plasma etching process with employment of the process gas of the fluorine-series gas. As a consequence, since the present invention is applied, the semiconductor chip manufacturing method having the superior general-purpose characteristics can be realized in the higher production efficiency by employing the simple step structures.

INDUSTRIAL APPLICABILITY

The semiconductor chip manufacturing method of the present invention has such an advantage that the test patterns can be removed in the higher efficiency in the simple steps while maintaining the general-purpose characteristics, and the above-described semiconductor chip manufacturing method may be usefully applied to such a technical field that a semiconductor wafer where a plurality of integrated circuits have been formed is divided with respect to each of the integrated circuits so as to manufacture individual semiconductor chips.

The invention claimed is:

1. A semiconductor chip manufacturing method in which a semiconductor chip containing a plurality of integrated circuits formed in a plurality of regions segmented by a plurality of scribe lines and containing a plurality of test patterns formed in said scribe lines is divided by a plasma etching process so as to manufacture individual semiconductor chips with respect to each of the integrated circuits, said semiconductor chip manufacturing method comprising:
   a test pattern removing step in which since laser light is irradiated from the side of circuit forming planes of said integrated circuits along the scribe lines of said semiconductor wafer, said test patterns are removed in combination with a front plane layer of said semiconductor wafer;
   a circuit protection seat adhering step for adhering a circuit protection seat on said circuit forming plane of said semiconductor wafer after said test pattern removing step is performed;
   a wafer rear plane grinding step for mechanically grinding said semiconductor wafer under such a condition that said circuit protection seat has been adhered from a rear plane of said circuit forming plane so as to thin the semiconductor wafer;
   a mask-purpose seat adhering step for adhering a mask-purpose seat on said rear plane of the semiconductor wafer after said wafer rear plane grinding step is performed, said mask-purpose seat constituting a mask in said plasma etching process;
   a mask work-processing step by which since laser light is irradiated from the side of said mask-purpose seat along the scribe lines of said semiconductor wafer on which said mask-purpose seat has been adhered, only a predetermined width of said mask-purpose seat on said scribe lines is removed so as to work-process said mask;
   a plasma dicing step by which since a portion in said semiconductor wafer, which corresponds to said removed predetermined width of the mask-purpose seat, is plasma-etched after said mask work-processing step is performed, a damaged layer produced by irradiating said laser light is removed, and also, said semiconductor wafer is divided with respect to the individual integrated circuits;
   an adhesive seat adhering step by which an adhesive seat is adhered onto said semiconductor wafer after said plasma dicing process is performed by covering an upper plane of said mask-purpose seat, while said adhesive seat is employed in order to hold the semiconductor chips under such a condition that said semi-conductor chips have been individually divided; and
   a circuit protection seat removing step for removing said circuit protection seat from the semiconductor wafer after said adhesive seat adhering step is performed.

2. A semiconductor chip manufacturing method as claimed in claim 1, wherein while the mechanically ground plane after said wafer rear plane grinding step is performed is defined as a subject, a processed alteration layer produced by the mechanical grinding operation is removed by a plasma etching process.

3. A semiconductor chip manufacturing method as claimed in claim 1, wherein while a resin seat provided with a die attach film is used as said mask-purpose seat, said mask-purpose seat is adhered in such a manner that said die attach film is contacted to the rear plane of said semiconductor wafer in said mask-purpose seat adhering step.

4. A semiconductor chip manufacturing method as claimed in claim 1, wherein prior to said plasma dicing step, a preliminary plasma etching process for enlarging an opening width of an opening portion of said mask-purpose seat removed by said laser light is carried out.

5. A semiconductor chip manufacturing method as claimed in claim 4, wherein an oxygen gas or a gas containing oxygen is used in said preliminary plasma etching process.

6. A semiconductor chip manufacturing method as claimed in claim 3, wherein said adhesive seat adhering step includes: a first adhesive seat adhering step for adhering said adhesive seat by covering an upper plane of said resin seat; a resin seat releasing step for releasing said resin seat in combination with said adhesive seat after the resin seat releasing step is performed; and a second adhesive seat adhering step for adhering an adhesive seat by covering an upper plane of said die attachment film after said resin seat releasing step is performed.

* * * * *